US006544719B2

(12) United States Patent
Coppens et al.

(10) Patent No.: US 6,544,719 B2
(45) Date of Patent: Apr. 8, 2003

(54) METHOD OF MAKING A HEAT-MODE LITHOGRAPHIC PRINTING PLATE PRECURSOR

(75) Inventors: Paul Coppens, Turnhout (BE); Ludo Vervloet, Kessel (BE)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 10/174,249

(22) Filed: Jun. 18, 2002

(65) Prior Publication Data

US 2003/0013044 A1 Jan. 16, 2003

Related U.S. Application Data

(60) Provisional application No. 60/312,819, filed on Aug. 16, 2001.

(30) Foreign Application Priority Data

Jun. 26, 2001 (EP) .............................................. 01000255

(51) Int. Cl.[7] ............................. G03F 7/36; G03F 7/07; G03F 7/11; G03F 7/16; G03F 7/004

(52) U.S. Cl. ................. 430/273.1; 430/204; 430/271.1; 430/278.1; 430/302; 430/616; 430/935

(58) Field of Search ................................ 430/616, 302, 430/278.1, 273.1, 271.1, 935

(56) References Cited

U.S. PATENT DOCUMENTS 6,132,938 A 10/2000 Yoshida et al.

FOREIGN PATENT DOCUMENTS

| | | | | |
|---|---|---|---|---|
| GB | 2325891 A | 12/1998 | | |
| JP | 2000284490 | 10/2000 | | |
| WO | WO 98/55310 | * 12/1998 | ................. | 430/616 |
| WO | WO 98/55330 | * 12/1998 | ................. | 430/616 |

OTHER PUBLICATIONS

European Search Report 01000255 (Nov. 30, 2001).

* cited by examiner

*Primary Examiner*—Richard L. Schilling
(74) *Attorney, Agent, or Firm*—Leydig, Voit & Mayer, Ltd.

(57) ABSTRACT

A cost efficient method of making a lithographic printing plate precursor is disclosed, the method comprising the steps of coating a silver halide emulsion layer on a hydrophilic base which is provided with physical development nuclei;

Figure 1:
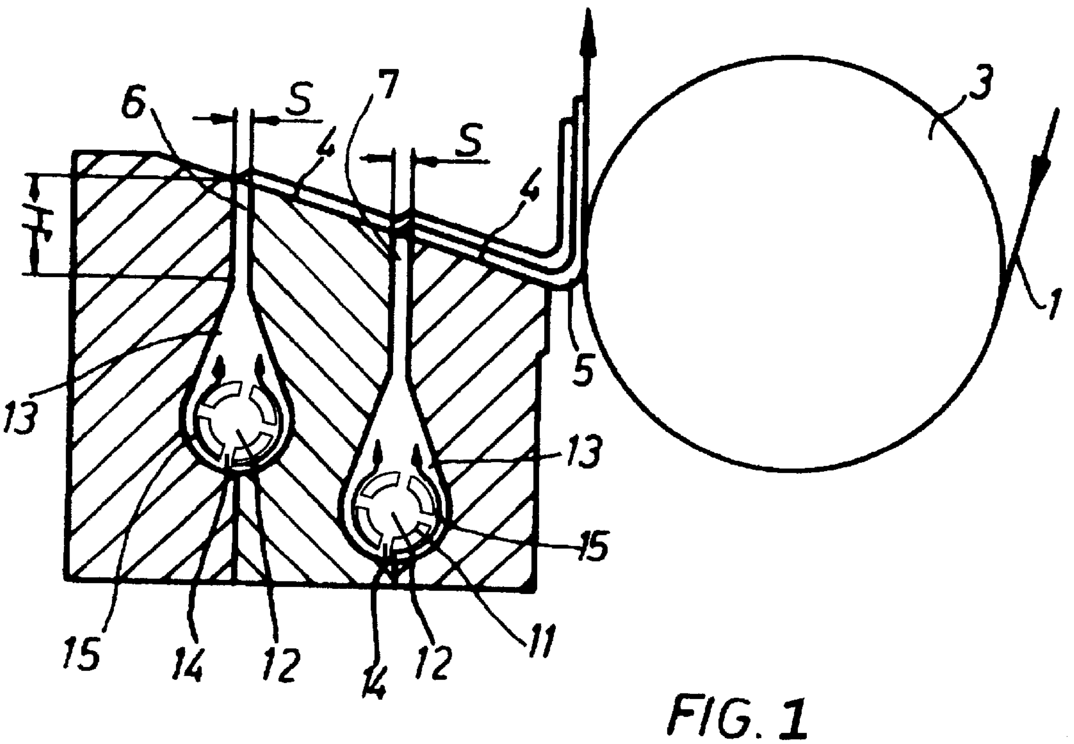

simultaneously with the preceding step, coating on the emulsion layer a solution that induces silver salt diffusion transfer reversal development of the silver halide;

allowing diffusion of complexed silver ions to the physical development nuclei, thereby forming silver metal that is deposited on the hydrophilic base;

a wash-off step wherein the emulsion layer is removed from the silver metal.

The material thus obtained can be exposed image-wise in heat-mode, e.g. by means of an infrared laser, thereby ablating the silver metal and revealing the hydrophilic base at exposed areas. Immediately after exposure, it can be used as a lithographic printing plate without the need for a wet processing step.

6 Claims, 1 Drawing Sheet

METHOD OF MAKING A HEAT-MODE LITHOGRAPHIC PRINTING PLATE PRECURSOR

This application claims the benefit of U.S. Provisional Patent Application No. 60/312,819, filed Aug. 16, 2001, which is incorporated by reference.

FIELD OF THE INVENTION

The present invention relates to a method of making a heat-mode lithographic printing plate precursor comprising a hydrophilic base and a hydrophobic silver metal layer provided on said base. The invention also relates to the method of heat-mode exposure of such a precursor, thereby causing ablation of the silver metal at exposed areas. The silver metal is obtained by the silver salt diffusion transfer reversal process.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional (so-called 'wet') lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

In recent years the so-called computer-to-plate method has gained a lot of interest. This method, also called direct-to-plate method, bypasses the creation of film because the digital document is transferred directly to a plate precursor by means of a so-called plate-setter. A lithographic printing plate precursor that is highly suitable for computer-to-plate imaging is the so-called Lithostar™ material, available from Agfa-Gevaert. Lithostar™ is a silver salt diffusion transfer reversal (DTR) material comprising, in the order given, a grained and anodized aluminum base, an image receiving layer comprising physical development nuclei, an intermediate layer and a silver halide emulsion layer. After image-wise exposure of the silver halide emulsion layer, the material is processed with a DTR developer which comprises silver halide solvent(s). The exposed silver halide is reduced by the developer so as to form chemically-developed silver metal in the emulsion layer. The non-exposed silver halide dissolves in the developer, diffuses to the physical development nuclei and is there reduced to form a silver metal deposit on the aluminum base. Subsequently the silver halide emulsion layer and any other optional hydrophilic layers are removed, the silver metal is hydrophobized, neutralized and finally gummed. Such DTR materials offer the benefits of high sensitivity and the capability of spectral sensitization to the complete visible wavelength range from violet to red light. The principles of the DTR process have been described e.g. in U.S. Pat. No. 2,352,014 and in the book "Photographic Silver Halide Diffusion Processes" by André Rott and Edith Weyde—The Focal Press—London and New York, (1972).

So-called thermal or heat-mode printing plate precursors are also widely used in computer-to-plate workflow, i.e. materials of which the imaging mechanism can be triggered by heat or exposure to infrared light. Also image-recording materials which require no processing or may be processed with plain water, ink or fountain are another major trend in plate making. Typical heat-mode materials which require no wet processing are based on ablation, such as the plate materials described in EP-A 580 393 and 580 394. EP-A 609 941 describes a heat-mode lithographic printing plate precursor comprising an ablative silver metal layer that is obtained by means of the DTR process. According to that method, a similar material as the above described Lithostar™ is processed by the plate manufacturer without exposure, so that a uniform hydrophobic silver metal layer is obtained on the grained and anodized aluminum support. That material can then be image-wise exposed in heat-mode by the end-user, thereby ablating the silver metal and revealing the hydrophilic surface of the support at exposed areas. Further improvements of this material and method have been described in EP-A 628 409; EP-A 816 071; WO98/055307; WO98/055307; WO98/055308; WO98/055309; WO98/055310; WO98/055311; WO98/055330; WO98/055331; WO98/055332; EP-A 934 824; EP-A 934 823; U.S. Pat. No. 5,916,734; U.S. Pat. No. 6,132,938; EP-A 1 106 349; and EP-A 1 106 382.

JP-A 2000-206678 describes a similar method for making a heat-mode lithographic printing plate precursor comprising an ablative silver metal layer that is obtained by means of the DTR process. First, an aluminum support which is provided with physical development nuclei is coated with a silver halide emulsion layer. Before the silver emulsion layer is completely dried, a DTR development solution is applied in a second coating step on the silver halide emulsion layer. The emulsion layer is then washed off and finally, the silver metal is hydrophobized and neutralized. A problem associated with this method is the requirement of two coating steps: in view of the high coating speed used during manufacturing of such materials, the required length of the coating alley makes this method very expensive and impractical. An alternative method wherein the developer is mixed with or injected into the coating liquid of the emulsion layer just before coating does not provide a solution for this problem because the development of the silver halide occurs very fast and the silver metal that is thereby formed, induces coating defects.

SUMMARY OF THE INVENTION

It is an object of the present invention to provide a method, which is cost efficient and provides a good coating quality, for making a heat-mode lithographic printing plate precursor containing an ablative silver metal phase as image-recording layer. This object preferably is achieved by the characterizing features of the present invention. Advantageous embodiments and further developments of the solution will be apparent from the description of the invention provided herein. It has been found that a DTR development solution can be coated as a second layer simultaneously with the silver halide emulsion layer without causing coating defects. Since the development solution makes contact with the wet emulsion layer as soon as it is coated, the chemicals in the developer diffuse immediately into the emulsion layer and physical development of the silver halide occurs very rapidly.

Specific features for preferred embodiments of the invention are set out in the dependent claims. Further advantages and embodiments of the present invention will become apparent from the following description.

DETAILED DESCRIPTION OF THE INVENTION

According to the method of the present invention, a silver halide emulsion layer and a solution, which induces silver salt diffusion transfer reversal development of the silver halide, are coated simultaneously on a hydrophilic base that is provided with physical development nuclei. Hereinafter, said solution which induces silver salt diffusion transfer reversal development of the silver halide shall be referred to briefly as "DTR development solution" or "DTR developer". Since the silver halide emulsion layer is not exposed to light, all the silver is dissolved by the DTR developer and deposited on the hydrophilic base to form a uniform layer. In a subsequent wash-off step the emulsion layer is removed from the silver metal and the material may then be dried, cut and shipped to the end-user. The hydrophobic character of the surface of the silver metal layer is preferably enhanced by applying a hydrophobizing agent thereto, either from the DTR developer or in a separate top coat that is applied after the wash-off step.

According to a further method of the present invention, the end-user exposes the lithographic printing plate precursor thus obtained in heat-mode, thereby ablating the silver metal and revealing the hydrophilic base at exposed areas so as to obtain a lithographic printing plate that is ready for printing without the need of a wet processing step.

The hydrophilic base used in the methods of the present invention may be a sheet-like material such as a plate or it may be a cylindrical element such as a sleeve which can be slid around a print cylinder of a printing press. The base has a hydrophilic surface or, alternatively, is a support that is provided with a hydrophilic layer, hereinafter called 'base layer'. In the latter embodiment, the support can be a flexible support, e.g. paper, plastic film, thin aluminum or a laminate of plastic and thin aluminum. Preferred examples of plastic film are polyethylene terephthalate film, polyethylene naphthalate film, cellulose acetate film, polystyrene film, polycarbonate film, etc. The plastic film support may be opaque or transparent. The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 $\mu$m and is preferably 1 to 10 $\mu$m.

In a more preferred embodiment, the hydrophilic base comprises a metal substrate such as aluminum or stainless steel. A particularly preferred hydrophilic base is an electrochemically grained and anodized aluminum substrate. The chemical graining process is preferably an electrochemical graining process which is carried out by passing the aluminum substrate through a bath containing at least a mineral acid, under the influence of an electric current. Preferably, said mineral acid is hydrochloric or nitric acid, which is applied to the aluminum surface either alone or in combination with another acid, preferably an organic acid such as acetic acid. Said organic acid is advantageously present at a level of 0–80 wt. %, preferably 0–10 wt. %, most preferably 0–5 wt. %. Especially effective results are obtained with a mixture of hydrochloric and acetic acids in a weight ratio of 2:1 to 1:4, preferably 1:2. Optionally said mineral acid may also contain amounts of salts at a level of 0–80 wt. %, preferably 0–20 wt. %; suitable examples of such salts include aluminum chloride, aluminum sulfate, aluminum nitrate, ammonium chloride and potassium hexafluorozirconate. The electric current may be a direct current or an alternating current, but is most preferably an alternating current having a current density of from 500–5000 A/m$^2$, most particularly from 2000–3000 A/m$^2$. The current can be applied in AC, sine or square waveforms having from 1 to 6 phases, with either positive or negative biasing, at ±10 V. The charge densities are from 1 to 1000 C/dm$^2$, preferably from 200 to 1000 C/dm$^2$. The graining process is carried out at a temperature of from 0–100° C., preferably from 20–50° C., for a dwell time of from 2 seconds to 3 minutes, preferably from 2 seconds to 20 seconds.

During the graining process, the aluminum is preferably provided with a 'smut' layer of gel-like amorphous colloidal oxides and hydroxides of aluminum and their hydrates incorporating metallic aluminum and inter-metallic aluminum alloys. More details of the smut layer are described in EP-A 1 106 382.

The surface of the preferred aluminum substrate comprises oxides of aluminum which are formed by means of an electrochemical anodizing process. Said process involves treatment of the grained substrate, preferably including the smut layer, in an acid bath, preferably comprising at least a mineral acid, in the presence of an electric current. Typically the mineral acid comprises sulfuric or phosphoric acid or a mixture of the two acids, preferably in a is weight ratio of from 1:10 to 1:1, most preferably in a weight ratio of around 1:7. The process could suitably be carried out using, for example, a total acid concentration of 8–15 wt. %, with a dwell time of from 2 seconds to 2 minutes, in a bath having a temperature of from 10° to 50° C. A suitable current density for the process would be in the region of 1000 A/m$^2$.

The hydrophilic surface of the base is provided with an image receiving layer comprising physical development nuclei, preferably in an amount ranging from 0.1 mg to 20 mg/m$^2$. The image receiving layer may be free of hydrophilic binder but may also comprise a hydrophilic colloid, e.g. polyvinyl alcohol to improve the hydrophilicity of the surface, in an amount up to 80 % of the total weight of the image receiving layer. Preferred development nuclei for use in accordance with the present invention are sulfides of heavy metals e.g. sulfides of antimony, bismuth, cadmium, cobalt, lead, nickel, palladium, platinum, silver, and zinc. Especially suitable development nuclei in connection with the present invention are palladium sulfide nuclei. Other suitable development nuclei are salts such as e.g. selenides, polyselenides, polysulfides, mercaptans, and tin (II) halides. Heavy metals in colloidal form, preferably silver, gold, platinum, palladium, and mercury can also be used.

The emulsion layer may be any layer comprising a hydrophilic colloid binder and at least one photographic silver halide emulsion. The emulsion layer preferably comprises between 1.0 and 1.5 g/m$^2$ of silver halide crystals, expressed in terms of grams of silver nitrate. The silver halide crystals are preferably free from silver bromide. Free from silver bromide means that the silver halide emulsion comprises less than 1 mole % of silver bromide, preferably less than 0.1 mole % of silver bromide, still more preferably less than 0.01 mole %. Also minor amounts of silver iodide may be present, e.g. less than 1 mole % and more preferably less than 0.1 mole %, but most preferably the silver halide crystals consists entirely of silver chloride. The silver halide crystals can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966). The average diameter of the silver halide grains may range from 0.10 to 0.70 μm, preferably from 0.25 to 0.45 μm. During the precipitation stage small amounts iridium and/or rhodium containing doping agents or a mixture of both can be added. The concentration of these compounds may range from $10^{-8}$ to $10^{-3}$ mole per mole of $AgNO_3$, preferably between $10^{-7}$ and $10^{-5}$ mole per mole of $AgNO_3$. The emulsions can be chemically sensitized e.g. by adding sulfur-containing compounds during the chemical ripening stage e.g. allyl isothiocyanate, allyl thiourea, and sodium thiosulfate. Also reducing agents e.g. the tin compounds described in BE 493 464 and 568 687, and polyamines such as diethylene triamine or derivatives of aminomethane-sulfonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Since the silver halide emulsion is processed without exposure immediately after coating, it is not required to add spectral sensitizers thereto, although this may be preferred for other reasons. The silver halide emulsions may contain the usual emulsion stabilizers, although this may be omitted in view of the fact that the silver halide is not shipped to the end-user. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) a hydrophilic colloid may be used, usually a protein, preferably gelatin. Preferably the emulsion layer is substantially unhardened. Gelatin can also be replaced in part or integrally by synthetic, semi-synthetic, or natural polymers, e.g. polyvinyl-pyrrolidone, starch, albumin, poly(vinyl alcohol), gum Arabic, hydroxymethylcellulose, etc. The silver halide emulsions may contain pH controlling ingredients. Preferably the silver halide emulsion is coated at a pH value not below the iso-electric point of the gelatin to avoid interactions between the silver halide emulsion layer and the hereafter mentioned intermediate layer.

Other ingredients such as antifogging agents, development accelerators, wetting agents, and hardening agents for gelatin may be present. More details about the composition, preparation and coating of silver halide emulsions suitable for use in accordance with the present invention can be found in e.g. Product Licensing Index, Vol. 92, December 1971, publication 9232, p. 107–109.

Although it is not required, also an intermediate layer may be provided between the image receiving layer and the emulsion layer in order to facilitate the removal of the emulsion layer from the silver metal during the wash-off step. In one embodiment, the intermediate layer is a water-swellable layer coated at a ratio of 0.01 to 2.0 $g/m^2$ and comprising at least one non-proteinic hydrophilic film-forming polymer e.g. polyvinyl alcohol as disclosed in EP-A 410 500. In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A 483 415.

The step of coating the emulsion layer and the DTR development solution in a single pass is preferably carried out by the cascade coating technique, represented in FIG. 1, or by the curtain coating technique. An overview of these coating techniques can be found in GB 1 388 245 and "Modern Coating and Drying Technology", Edward Cohen and Edgar B. Gutoff Editors, VCH publishers, Inc, New York, N.Y., 1992. FIG. 1 shows a typical cascade-coating head with an inclined flow plane (4) interrupted by delivery gaps (6) and (7). The coating solutions are supplied to the coating head via first pressure-distributing chambers (11) in the form of a long tube (12) extending over the entire width of the coating head. A plurality of bores (14) connect first pressure-distributing chambers (11) with second pressure-distributing chambers (13). The coating solutions flow through bores (14) from the first (11) to the second pressure-distribution chambers (13) as indicated by arrows (15). According to the present invention, the DTR development solution may be supplied via delivery gap (6) and the emulsion coating solution via delivery gap (7). Both coating solutions flow to the lower end of the flow plane (4) where the coating meniscus (5) is formed, preferably by maintaining a sub-pressure between the coating head and the coating roller (3). The hydrophilic base (1) is guided over coating roller (3) at a short distance from the coating head. According to the present invention, the emulsion layer is coated on the hydrophilic surface of the base and the DTR development solution is coated on top of the emulsion layer.

The wet coating thickness of the emulsion layer is preferably between 5 and 20 μm, more preferably about 10 μm. The wet coating thickness of the DTR developer is preferably between 20 and 60 μm, more preferably about 40 μm. The emulsion is preferably coated at a temperature of about 36° C.

The DTR developer preferably comprises one or more silver halide solvent(s), which acts as a complexing agent for silver halide, and a developing agent which is capable of reducing the complexed silver ions to silver metal. It is also possible to incorporate one or more silver halide solvent(s) into the emulsion instead of adding such compounds to the DTR developing solution that, according to the present invention, is coated on the emulsion layer. Likewise, the silver reducing agent may be present in the emulsion layer and/or in said DTR developer solution. In it most simple form, the DTR developer that is coated on the emulsion is an aqueous solution of an alkaline compound and all the other compounds that are required for DTR development and hydrophobization of the silver metal are contained in the emulsion layer or another layer in water-permeable relationship with the emulsion layer.

The DTR developer may contain silver halide solvent(s) in an amount between 0.05 % by weight and 5 % by weight and more preferably between 0.5 % by weight and 2 % by weight. The silver halide solvent is preferably a water-soluble thiosulfate or thiocyanate e.g. sodium, potassium, or ammonium thiosulfate and sodium, potassium, or ammonium thiocyanate. Further silver halide solvents that can be used in connection with the present invention are e.g. sulfite, amines, 2-mercaptobenzoic acid, cyclic imide compounds such as e.g. uracil, 5,5-dialkylhydantoins, alkyl sulfones and oxazolidones. Further silver halide solvents for use in connection with the present invention are alkanolamines. Examples of alkanolamines that may be used in connection with the present invention correspond to the following formula:

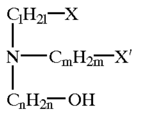

wherein X and X' independently represent hydrogen, a hydroxyl group or an amino group, l and m represent 0 or integers of 1 or more and n represents an integer of 1 or more. Said alkanolamines may be present in the DTR developer in a concentration preferably between 0.1 % and 5 % by weight. However part or all of the alkanolamine can be present the silver halide emulsion layer or another layer in water-permeable relationship therewith.

Still other preferred silver halide solvents for use in connection with the present invention are thioethers. Preferably used thioethers correspond to the following general formula:

$$Z\text{-}(R_1—S)_t—R_2—S—R_3—Y$$

wherein Z and Y each independently represents hydrogen, an alkyl group, an amino group, an ammonium group, a hydroxyl, a sulfo group, a carboxyl, an aminocarbonyl or an aminosulfonyl, $R_1$, $R_2$ and $R_3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 554 585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Silver reducing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulfonic acid group etc. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

Preferred amounts of the hydroquinone-type developing agents are in the range of 0.05 mole to 0.40 mole per liter and preferred amounts of secondary developing agent(s) in the range of $1.8\times10^{-3}$ to $2.0\times10^{-1}$ mole per liter.

The DTR developer may further comprise sulfite e.g. sodium sulfite in an amount ranging from 40 g to 180 g per liter, preferably from 60 to 160 g per liter. The DTR developer may comprise other ingredients such as e.g. oxidation preservatives, calcium-sequestering compounds, anti-sludge agents, and hardeners including latent hardeners.

The quantitative ranges given for the developing agents, silver halide solvents, and sulfite apply to the amount of these compounds present as solutes in the DTR development solution during coating, whether these compounds make part of the DTR development solution or were dissolved from the layer(s) containing them upon application thereto of the DTR development solution.

The DTR developer preferably has a pH between 9 and 14 and more preferably between 10 and 13, but depends on the type of silver halide emulsion material to be developed, intended development time, and processing temperature. The pH of the DTR developer may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate. Suitable organic alkaline substances are e.g. alkanolamines. In the latter case the alkanolamines act both as a silver halide complexing agent and a pH regulator.

As mentioned above, the DTR developer may further comprise hydrophobizing agents for improving the hydrophobicity of the silver metal obtained in the image receiving layer. Generally these compounds contain a mercapto group or thiolate group and one or more hydrophobic substituents. Particularly preferred hydrophobizing agents are mercapto-1,3,4-thiadiazoles as described in DE-A 1 228 927 and in U.S. Pat. No. 4,563,410, 2-mercapto-5-alkyl-oxa-3,4-diazole, 3-mercapto-5-alkyl-1,2,4-triazoles and long chain (at least 5 carbon atoms) alkyl substituted mercaptotetrazoles. The hydrophobizing agents can be used alone or in combination with each other. These hydrophobizing compounds can be added to the DTR developer in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds. In a more preferred embodiment, the DTR developer does not contain a hydrophobizing agent and the silver metal is coated with a top layer which comprises the hydrophobizing agent. This top layer is further discussed below.

After the coating step, diffusion transfer development is allowed to occur during a time period which is preferably longer than 5 seconds and preferably shorter than 30 seconds. The development time can be shortened by optional heating of the coating, e.g. by means of hot air or infrared radiation. It is preferred that the coating is not dried before the wash-off step in which the emulsion layer and any optional layer is removed from the deposited silver metal. The development may be stopped—though this is often not necessary—with a so-called stabilization liquid, which actually is an acidic stop-bath having a pH preferably in the range from 5 to 7. Buffered stop bath compositions comprising a mixture of sodium dihydrogen orthophosphate and disodium hydrogen orthophosphate and having a pH in said range are preferred.

After DTR development, a silver metal layer is obtained which consists of silver metal particles having an average thickness of preferably from 10 nm to 100 nm, most preferably from 10 nm to 50 nm. The silver metal layer may be discontinuous, i.e. it may be possible that the hydrophilic surface of the base is not completely covered by the silver metal when viewed on a microscopic scale.

The wash-off step can be carried out e.g. by immersing the material in water and optional mechanical rubbing using a sponge, a cotton pad, a roller, a rotating brush, or by supplying the water as a pressurized jet. Preferably a protease enzyme is added to the water, e.g. alcalase. The temperature of the water is preferably between 25 and 60° C. A high temperature is preferred since this facilitates the optional drying step that may follow the wash-off stop. Drying may be carried out e.g. with hot air or infrared radiation.

In a preferred embodiment, the DTR developer does not contain a hydrophobizing agent but the latter is provided by applying a top coat on the silver metal. The top coat can be applied by e.g. immersing the material in a solution followed by squeezing between a roller pair or by a coating technique, e.g. extrusion coating or slot coating.

A preferred top coat has been described in EP-A no. 01200230, filed on Jan. 23, 2001. The top coat preferably comprises at least one hydrophobizing agent which adsorbs onto the metallic surface, and at least one hydrophilic stain-reducing agent which is also able to adsorb on the metallic surface. The hydrophilic stain-reducing agent should be less strongly adsorbing than the hydrophobizing agent and the relative quantities used should be such that the hydrophobizing agent is not desorbed from the metallic surface. Specifically, the hydrophobizing agents are typically those disclosed on pages 105 to 106 of the publication "Photographic Silver Halide Diffusion Processes" by Andre Rott and Edith Weyde, The Focal Press, London and New York, 1972. Examples of suitable hydrophobizing agents include various mercaptan, mercapto and thio derivatives, such as dodecylmercaptan, octadecylmercaptan, 2-mercaptobenzothiazole, 2-mercaptobenzoxazole, 2-mercapto-5-methylbenzimidazole, 1-octyl-1,2,4,5-tetrahydro-s-triazine-5-thiol, 1,3-diphenyl-2-thiourea, 4-phenyl-3-thiosemicarbazide, dodecyl-3-mercaptopropionate, octyl thiosalicylate and 6-octyl-2-thiouracil. Preferred hydrophobizing agents are the mercaptotetrazoles and mercaptooxadiazoles, specifically 1-phenyl-5-mercaptotetrazole, sodium 1-octyl-5-mercaptotetrazole and n-heptyl-2-mercapto-1,3,4-oxadiazole. The hydrophobizing agent is applied to the metallic layer in an amount of from 0.1 to 10 $mg/m^2$, preferably from 1 to 5 $mg/m^2$.

Significant stain reductions in the ablated areas have resulted from the application of a top coat comprising hydrophilic agents which include at least one sulfur, selenium or tellurium containing group. In particular, suitable groups include thiol groups, substituted thio groups which are readily hydrolyzed to provide thiol groups, disulfide groups, thioacid groups, thioamide groups and thiocyanate groups, together with the selenium and tellurium analogues of the foregoing. Examples of hydrophilic stain-reducing agents for incorporation in the top coat include the following materials:

Thiosulfates, such as sodium thiosulfate or ammonium thiosulfate.

Thiocarboxylic acids, such as 2-mercaptosuccinic acid and its salts.

Thioalcohols, such as 2-mercapto-1,3-propanediol.

Thioamides, such as thiourea.

Thio containing amino acids, such as L-cysteine.

Thiosulfonic acids, such as 3-mercapto-1-propanesulphonic acid and its salts.

Thiocyanates, such as potassium thiocyanate.

Most preferably, the hydrophilic agent comprises sodium thiosulfate. The hydrophilic stain-reducing agent is preferably applied to the silver layer in an amount of from 0.01 to 5 $g/m^2$, preferably from 0.01 to 0.5 $g/m^2$.

Preferably, the top coat also includes at least one additional hydrophilic material which, in addition to serving as a binder, can act as an ink desensitizer for the anodized aluminum surface revealed after imagewise ablation of the overlying metallic layer, ultimately rendering said aluminum surface more hydrophilic, and hence reducing unwanted take-up of ink in the background, non-image, areas. Virtually any of the hydrophilic materials commonly used as desensitizing agents for background areas of lithographic printing plates during printing operations may be used for present purposes, but specific examples include sodium hexametaphosphate, sodium gluconate, dextrin, gum arabic and sorbitol. During conventional platemaking operations, desensitizing agents of this type are generally applied to a plate surface following imagewise exposure and, when appropriate, development. However, the presence of said hydrophilic materials and the hydrophilic stain reducing agent prior to exposure obviates the requirement for such post-exposure treatments, and facilitates direct-to-press application of the printing plate. Thus, the plate may be directly transferred to a printing press following exposure, without the requirement for any intermediate treatment, since the hydrophilic materials are readily removable from the silver image in printing areas by means of aqueous washing; such washing is effectively achieved by the action of the typical aqueous fount solutions and fount-ink mixtures commonly used on printing presses, and the hydrophilic material is thereby replaced by a film of ink in image areas and fount in background, non-image areas. An alternative means of direct-to-press exposure is also possible, wherein the plate precursor is exposed in situ on a printing press.

The top coat preferably contains also at least one sensitizing agent which adsorbs onto the silver metal and provides increased sensitivity to heat mode laser exposure. Various compounds are known to adsorb on to silver metal and several of these have been found to provide such an increase in sensitivity. Specifically, significant sensitivity improvements have resulted from the application of layers comprising compounds which include at least one sulfur, selenium or tellurium containing group. In particular, suitable groups include thiol groups, substituted thio groups which are readily hydrolyzed to provide thiol groups, disulfide groups, thioacid groups, thioamide groups and isothiocyanate groups, together with the selenium and tellurium analogues of the foregoing. In addition, improvements in sensitivity have resulted from the incorporation of cationic materials, in particular cationic surfactants or cationic dyes, in the topmost layer of such a lithographic printing plate precursor. Preferably, the sensitizing material is present in the layer to the extent of between 5 and 50 wt. %.

Particular examples of sensitizing compounds which are suitable for incorporation in the topmost layer of the lithographic printing plate precursors of the present invention include the following:

Thiol derivatives such as dodecylmercaptan, 1-methyl-5-mercaptotetrazole, 1-phenyl-5-mercaptotetrazole, sodium 1-octyl-5-mercaptotetrazole, n-heptyl-2-mercapto-1,3,4-oxadiazole, 2-mercaptobenzothiazole, 1,4-dithioerythritol, thiosalicylic acid, mercaptosuccinic acid potassium salt, 2-mercaptobenzoxazole, 2-mercaptobenzimidazole and 3-mercapto-4-methyl-4H-1,2,4-triazole.

Hydrolyzable thio compounds such as S-diethylaminoethyl isothiuronium chloride hydrochloride.

Disulfide compounds such as tetramethylthiuram disulfide, cystine and 2,2'-dithiobenzoic acid.

Thioacids such as thiobenzoic acid and their salts including, for example, potassium ethyl xanthate and sodium diethyldithiocarbamate.

Thioamides such as thiourea, allylthiourea, thiosemicarbazide, dithizone, dithiooxamide and 2-thiobarbituric acid.

Isothiocyanates such as phenyl isothiocyanate.

Selenium and tellurium analogues of the foregoing thio compounds such as 2-selenylbenzothiazole and selenourea.

Cationic surfactants such as benzyldimethyltetradecylammonium chloride, cetylpyridinium iodide, di-dodecyldimethylammonium chloride, (diisobutylphenoxyethyl)dimethylbenzylammonium chloride, trioctylmethylammonium chloride, octadecyltrimethylammonium bromide, methylpolyoxyethylene(15)cocoammonium chloride, dimethyloctadecylsulfonium-p-toluene sulfonate and Zonyl FSD (a fluorinated cationic surfactant supplied by E I du Pont de Nemours & Co.)

Cationic dyes such as Methylene Blue, Brilliant Green, Phenosafranine, Pinacryptol Yellow and Crystal Violet.

The top coat may further include wetting agents, dispersing agents, biocides, buffers, dyes, or other materials which may enhance the press performance of the final printing plate, in addition to the hydrophilic materials previously discussed. The coating solution preferably has a pH of between 3 and 10, since damage to the silver metal may result from a coating solution having a pH which is either too high or too low.

The sensitizing material may be present as a monolayer, or it may be applied together with the other materials previously specified to give a dry coating weight of up to 10 $g/m^2$. Preferably, the sensitizing material is present in an amount sufficient to provide at least a monolayer on the plate surface. Thus, in the absence of other materials, the sensitizing material is preferably present at a coating thickness of between a monolayer and 0.5 $\mu$m, preferably between 0.01 and 0.1 $\mu$m. When other materials are present in the top layer, this is preferably applied to give a dry coating weight of between 0.01 and 10 $g/m^2$, preferably between 0.05 and 0.5 $g/m^2$. Preferred additional components of the said layer should, after exposure, be readily removed from the surface of the metallic layer by simple aqueous washing in order to facilitate rapid ink acceptance in image areas, thereby ensuring that the plate has good roll-up properties.

The lithographic printing plate precursor prepared by the methods of the present invention can be imaged by a beam of radiation, preferably from a laser operating in the infrared region of the spectrum. Examples of suitable infra-red lasers include semiconductor lasers and YAG lasers, for example the Gerber Crescent™ 42T Platesetter or the Galileo Talant™ available from Agfa-Gevaert. Exposure to the beam of radiation causes ablation of the silver layer to occur in the radiation-struck areas. Additionally, the silver layer may be exposed to lasers providing radiation of other wavelengths, such that a heating effect—which leads to ablation—is produced. A suitable example is a KrF laser outputting at 248 nm and generating power density of 3 $MW/cm^2$.

The exposure apparatus is preferably provided with a vacuum suction device which collects ablated silver from the plate. Preferred configurations have been described in EP-A 882 582; EP-A 671 278; and EP-A 1 110 628.

Said exposure may be carried out with the printing plate precursor mounted on a printing press (on-press imaging) or, in the alternative, using an off-line plate setter (off-press imaging). In the latter case, following imagewise exposure, the resulting plate may be directly mounted on a printing press; in either event, removal of the top layer, together with any silver particles remaining in exposed areas, occurs either as a result of the action of the press fount solutions, or other start-up chemicals, on the plate surface, or during the course of other procedures involved in the printing operation. In such cases of exposure on press or direct transfer from exposure station to press, it is desirable that at least one of the adsorbed sensitizing materials in the top layer should additionally be able to confer increased hydrophobicity on the silver metal layer, thus ensuring good ink acceptance in the image areas.

Alternatively, after exposure, the plate may be subjected to a manual or automatic scrubbing and/or soaking treatment with an aqueous solution in order to remove the top layer; this procedure, which is described in WO 98/55309, additionally facilitates removal of any silver particles remaining in exposed areas, and enables the cosmetic appearance of the plate to be improved prior to press operations. Following, or concurrent with, this cleaning step, the plate may be prepared for printing operations by treatment with an aqueous composition comprising at least one hydrophobizing agent for the image areas and at least one compound capable of desensitizing the non-image areas to ink. In this way, it is possible to ensure good ink acceptance in image areas and a high degree of hydrophilicity in background areas, thus enabling a good start-up on press to be achieved.

EXAMPLE

An emulsion coating solution was prepared by adding water to a photographic emulsion comprising 45 g, expressed as silver nitrate, of silver halide (average crystal diameter 0.35 $\mu$m, AgCl with 1.5 mole % of AgBr and 0.2 mole % of AgI) and 18 of gelatin so as to obtain a total volume of 450 ml.

A DTR development solution was prepared by mixing 4140 ml of water 90 g of a 50 wt. % of sodium hydroxide in water 300 g of anhydrous sodium sulfite 30 g of anhydrous sodium thiosulfate 1 g of potassium bromide 125 g of hydroquinone.

The emulsion coating solution and the DTR development solution were coated simultaneously on a grained and anodized aluminum support provided with Ag° physical development nuclei using a cascade coating technique at a wet coating thickness of 10 and 40 $\mu$m respectively. After coating, the emulsion layer contained 1 $g/m^2$ of silver chloride, expressed as silver nitrate. 20 seconds after coating, the emulsion layer was removed by spraying water, followed by immersion in a top coat solution that was prepared by mixing the following ingredients:

1.5 g of octylmercaptotetrazoline 5 g of tri(hydroxy)aminomethane 25 g of (trisodium citrate)0.2 aqua 25 g of sodium hexametaphosphate 25 ml of a 70 wt. % aqueous solution of sorbitol 0.2 g of phenol 20 g of (sodium thiosulfate)0.5 aqua 60 ml of Mersolat H76 (an anionic alkylsulfonate surfactant from Bayer, 76 wt. % aqueous solution)

0.1 g of anti-foam agent SE57 from Wacker Chemie water to make 1 liter.

The lithographic printing plate precursor thus obtained is a high quality ablative image-recording material that is suitable for infrared laser exposure.

We claim:

1. A method of making a heat-mode lithographic printing plate precursor comprising the steps of coating a silver halide emulsion layer on a hydrophilic base which is provided with physical development nuclei;

simultaneously with the preceding step, coating on the emulsion layer a solution that induces silver salt diffusion transfer reversal development of the silver halide;

allowing complexed silver ions to diffuse to the physical development nuclei, thereby forming silver metal that is deposited on the hydrophilic base;

a wash-off step wherein the emulsion layer is removed from the silver metal.

2. A method according to claim 1 wherein the emulsion layer and the development solution are coated by means of a cascade coating technique or a curtain coating technique at a wet coating thickness of between 5 and 20 $\mu$m for the emulsion layer and 20 and 60 $\mu$m for the development solution.

3. A method according to claim 1 wherein the time period between the coating step and the wash-off step is between 5 and 25 seconds.

4. A method according to claim 1 further including the step, after the wash-off step, of applying a top coat on the silver metal layer, said top coat comprising a silver metal hydrophobizing agent.

5. A method according claim 4 wherein the top coat further comprises a hydrophilic stain-reducing agent.

6. A method according claim 4 wherein the top coat further comprises a sensitizing agent.

* * * * *